United States Patent [19]

Hadidi

[11] Patent Number: 5,489,904
[45] Date of Patent: Feb. 6, 1996

[54] ANALOG CURRENT MODE ANALOG/DIGITAL CONVERTER

[75] Inventor: Khayrollah Hadidi, Tokyo, Japan

[73] Assignee: The Regents of the University of California, Oakland, Calif.

[21] Appl. No.: 127,761

[22] Filed: Sep. 28, 1993

[51] Int. Cl.⁶ .............................. H03M 1/14; H03M 1/68
[52] U.S. Cl. ......................... 341/156; 341/136; 341/145
[58] Field of Search ................................. 341/133, 136, 341/145, 156

[56] References Cited

U.S. PATENT DOCUMENTS

| | | | |
|---|---|---|---|
| 4,016,555 | 4/1977 | Tyrrel | 341/145 |
| 4,485,372 | 11/1984 | Holloway | 340/347 |
| 4,558,242 | 12/1985 | Tuthill et al. | 307/577 |
| 4,647,903 | 3/1987 | Ryu | 340/347 |
| 4,692,738 | 9/1987 | Suzuki | 340/347 |
| 5,057,841 | 10/1991 | Veerhoek et al. | 341/156 |
| 5,061,926 | 10/1991 | Washiyama | 341/122 |
| 5,072,220 | 12/1991 | Petschacher et al. | 341/156 |
| 5,117,235 | 5/1992 | Ho-sun | 341/159 |
| 5,146,225 | 9/1992 | Theus | 341/152 |
| 5,345,237 | 9/1994 | Kouno et al. | 341/156 |

OTHER PUBLICATIONS

G. C. Temes, "High Accuracy Pipeline A/D Convertor Configuration," *Electronic Letters*, vol. 21, No. 17, pp. 762–763, Aug., 1985.

Fig. 3.1 The Pipeline A/D Converter, prior to the filing date of the present application.

Fig. 3.5 Block diagram of a general pipelined A/D converter, prior to the filing date of the present application.

Kh. Hadidi et al., "An 8–b 1.3–MHz Successive–Approximation A/D Converter," *IEEE Journal of Solid–State Circuits*, vol. 25, No. 3, Jun. 1990.

Kh. Hadidi et al., "A New Method of Implementing DACs in CMOS Subranging Stages," University of California, Los Angeles.

Kh. Hadidi et al., "Fast Successive–Approximation A/D Converters," University of California, Los Angeles, prior to filing date of the present application.

*Primary Examiner*—Howard L. Williams
*Attorney, Agent, or Firm*—Loeb and Loeb

[57] ABSTRACT

An improved subranging or comparator circuit is provided for an analog-to-digital converter. As a subranging circuit, the circuit produces a residual signal representing the difference between an analog input signal and an analog of a digital representation. This is achieved by subdividing the digital representation into two or more parts and subtracting from the analog input signal analogs of each of the individual digital portions.

In another aspect of the present invention, the subranging circuit comprises two sets of differential input pairs in which the transconductance of one differential input pair is scaled relative to the transconductance of the other differential input pair. As a consequence, the same resistor string may be used for two different digital-to-analog converters of the subranging circuit.

32 Claims, 6 Drawing Sheets

FIG. 1

PRIOR ART

ANALOG CURRENT MODE ANALOG/DIGITAL CONVERTER

This invention was made with support under NASA Grant No. NAG 2-360 and NSF Grant No. MIP 9014127. Accordingly, the U.S. Government may have certain rights in the invention.

BACKGROUND OF THE INVENTION

1. Field of the Invention

The present invention relates to comparators, analog-to-digital converters, and digital-to-analog converters, and more particularly, to such circuits implemented in integrated circuits.

2. Description of Related Art

One type of analog-to-digital converter converts an analog input signal to a digital representation in such a manner that each bit of the digital representation is generated substantially at the same time as the other bits. As a consequence, these converters, often referred to as "flash" converters, can convert an analog signal to a digital representation very quickly, typically in one clock cycle in synchronous circuits. One type of flash converter performs the conversion by comparing the analog input signal to each of a plurality of reference voltages and providing a digital output in accordance with the reference voltage which most closely matches the analog input signal. The reference voltages are typically provided by a string of resistors and the comparison is performed by a bank of comparators. Many flash converters can require as many as $2^N$ resistors and $2^N-1$ comparators for N bits of resolution. Because the required number of resistors and comparators and the input capacitance of the A/D converter can grow exponentially for each desired bit of resolution, flash converters have often not been practical for analog-to-digital converters having a relatively high degree of resolution (on the order of 10 bits or more).

To reduce the complexity of high resolution converters, many converters generate the digital output one bit at a time, starting with the most significant bit. The analog value of the first bit is subtracted from the input signal being sampled to produce an analog residue signal. Then, as each subsequent bit is generated, the analog value of the bit is subtracted from the residue. These converters, often referred to as "successive-approximation converters," can require at least one clock cycle for each bit of resolution and are therefore generally much slower than flash converters.

A third converter architecture, usually referred to as a "multi-step converter", combines the approaches of both the flash converter and the successive-approximation converter. The multi-step converter employs a flash converter to produce a first subset of bits which conventionally are the more significant bits of the complete digital representation. These bits, which provide a coarse approximation of the complete digital representation, are then converted by a digital-to-analog converter back to an analog signal which is subtracted from the analog input signal. The resultant residue signal is then converted in a second step to a second subset of digital bits which represent the less significant or fine resolution bits. The complete digital representation of the analog input signal may then be obtained by combining the coarse bits obtained in the first step with the fine bits obtained in the second step. Such an arrangement has the advantage of substantially reducing the overall size of the converter as compared to a single step flash implementation yet is substantially faster than a typical successive-approximation converter.

The process by which the analog equivalent of previously generated digital bits is subtracted from an analog input signal is referred to as "subranging". There are generally two techniques by which subranging is performed. In the direct approach, the bits are converted to an analog voltage signal by a digital-to-analog converter. The analog voltage signal is then subtracted from the analog input signal to produce a residue signal for subsequent conversion. Alternatively, the subtraction is performed indirectly by subtracting an electric charge corresponding to the digital bits from an electric charge corresponding to the input signal. Charge balancing structures typically utilize the indirect technique.

The digital-to-analog converter of a direct type subranging stage may be implemented, in a variety of different circuits. One approach is to use a single resistor string which provides a series of incremental voltages. Switches are operated in response to the digital input to couple the appropriate voltage to the output of the digital-to-analog converter. If the digital-to-analog converter is required to convert a digital representation having a large number of bits, the converter can require a very large number of switches together with a complex logic circuit to provide appropriate clock signals.

Another approach to implement a digital-to-analog converter in a direct type subranging stage, is to use a "current-mode" digital-to-analog converter. In response to a digital word the current mode DAC switches on an appropriate number of current cells. The sum of these currents can be applied across a resistor to create an analog voltage. By applying the analog input signal to the noninverting input of an amplifier and the analog voltage across the resistor (i.e., the output of the current-mode DAC) to the inverting input of the same amplifier, an amplified residue voltage will be created at the output of amplifier. This method requires both a large amount of area as well as power for the higher resolutions. The power requirements can be reduced by increasing the value of the resistor and reducing current of unit cell but such an increase can slow down the DAC.

An indirect type digital to analog converter for a subranging stage may use, in combination with a resistor string, a capacitor array. This technique can reduce the required number of switches but usually requires in addition to the capacitor array, a charge balancing amplifier.

Yet another analog-to-digital converter, known as a "current-mode" converter, typically transforms the analog input signal to an input current using a linear transconductance stage. Each bit of the digital representation to be converted is similarly transformed into separate currents which are subtracted from the input current at a summing junction. In high resolution applications, current-mode digital-to-analog converters generally require a large chip area and power for a large number of current source cells. In addition, highly linear transconductance stages are often difficult to achieve, particularly for wide ranges of input signals.

To reduce the size of the subranging stage of the converter circuit, the digital-to-analog conversion can itself be performed in separate stages. However, because each succeeding stage must typically await the results of the conversion process of the prior stage, the overall speed of the converter circuit is often substantially reduced as a consequence.

A pipeline converter has several stages in which each stage can provide one or more bits of every sample of the input signal. The term "pipeline" refers to the fact that every sample passes through all stages and specific bits of each sample are provided by a specific stage. Furthermore, while one stage is processing a sample of the input signal the next sample is processing the previous sample and so on. Thus, all stages are providing bits at the same time but for different samples of the input signal. Although most existing pipeline analog-to-digital converters deliver the residue of each sample from one stage to the other after subranging, one proposed converter (G. C. Temes, "High Accuracy A/D Converter Configuration," *Electronic Letters,* Vol. 21, No. 17, pages 762–763, August, 1985) forwards the sample intact from one stage to the other. This latter converter has the advantage that it does not distort the samples due to imperfections of subranging stages. Nonetheless, creation of reference levels at latter stages for this pipeline architecture can be quite complex.

SUMMARY OF THE INVENTION

It is an object of the present invention to provide an improved converter circuit, obviating, for practical purposes, the above-mentioned limitations, particularly in a manner requiring a relatively uncomplicated electronic arrangement.

These and other objects and advantages are achieved by, in accordance with one embodiment of the present invention, a subranging circuit for an analog-to-digital converter, which produces a residue signal representing the difference between an analog input signal and an analog of a digital representation, by subdividing the digital representation into two or more parts. The subranging circuit subtracts from the analog input signal, analogs of each of the individual digital portions. As explained in greater detail in the discussion to follow, such an arrangement can significantly reduce the complexity of the subranging circuit so as make more practical high resolution applications. In addition, the circuit can be implemented as a comparator circuit for a variety of converter architectures including successive approximation converters and pipeline converters.

For example, in the illustrated embodiment, the circuit employed as a subranging circuit effectively subtracts the analog of a 7 bit digital representation from the analog input signal to produce a residue signal for conversion by another stage. However, the 7 bit digital representation is first subdivided into two parts in the illustrated embodiment, the five most significant bits in one part and the two least significant bits in the other part. A first digital-to-analog converter converts the five most significant bits to an analog signal which is subtracted from the analog input signal. At the same time, the two least significant bits are also converted by a second converter to an analog signal which is also subtracted from the analog input signal such that a residue signal is produced representing the difference between the analog input signal and the analog of the entire 7 bit digital representation. Because the digital representation is subdivided into two or more portions, the resolution of each individual digital-to-analog converter is reduced such that the overall complexity of the circuit is substantially reduced as well. Furthermore, because the digital portions are converted in parallel, any reduction in speed of the circuit is minimized.

In the illustrated embodiments, the subranging or comparator circuit comprises a first pair of differential input transistors having one input coupled to the analog input voltage signal and the other input coupled to the output of the digital-to-analog converter for the most significant bit portion of the digital representation. The output of the first pair of differential input transistors is an analog current signal which is a function of the difference between the analog input voltage signal and the analog of the most significant bit portion. The circuit further comprises a second pair of differential input transistors having one input coupled to a reference voltage and a second input coupled to the output of a second digital-to-analog converter which converts the least significant bits of the digital representation. The output of the second pair of differential input transistors is a second analog current signal which is a function of the least significant bits. The outputs of the two pairs of differential input transistors are combined at a summing junction in such a manner that the second analog current signal is subtracted from the first analog current signal to provide the aforementioned residue signal. In the illustrated embodiment, the summing junction is the input of a transimpedance stage, which provides low impedance input nodes. If the output of the transimpedance stage is provided to a latch, the circuit will function as a comparator which compares the analog input signal to an analog of the digital input signal.

In another aspect of the invention, each of the aforementioned input transistor pairs has a single transistor current source having a matching channel length. Such an arrangement has been found to significantly reduce variation in transconductance as a function of common mode voltage. As a consequence, the transconductance of the two differential input pairs remain substantially unaffected by differences in their respective common mode voltages.

To further reduce the complexity of the subranging or comparator circuit, the transconductance $g_m$ of one pair of differential input transistors is scaled relative to the transconductance of the other pair. As a consequence, the same resistor string can be used for both digital-to-analog converter circuits and need have no more resistors than that required by the digital-to-analog converter circuit having the greater resolution. Thus, for example, if the digital representation is subdivided into two portions of 5 bits and 2 bits, respectively, the maximum number of resistors required would be $2^5$ or 32 resistors rather than $2^7$ or 128, thereby substantially reducing the total number of resistors required.

These and other objects and advantages will be made more clear in connection with the following detailed description of the drawings identified below.

DETAILED DESCRIPTION OF THE DRAWINGS

Figure 1:
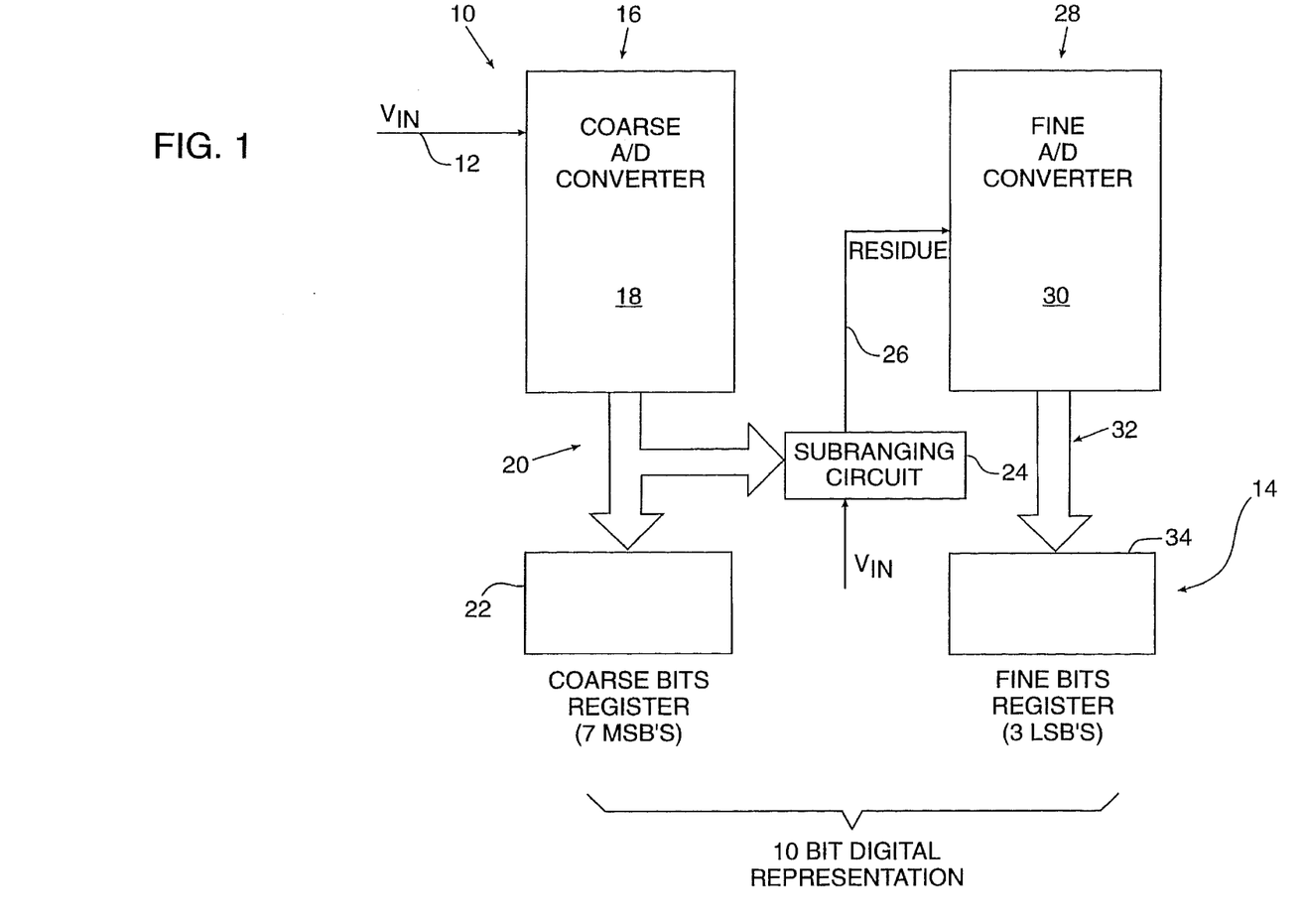
FIG. 1 is a schematic representation of an analog-to-digital converter.

A two stage analog-to-digital converter circuit is indicated generally at 10 in FIG. 1. The converter circuit 10 converts an analog input signal $V_{in}$ provided at an input 12, into a 10 bit digital representation at a digital output 14. A first stage 16 of the converter 10 includes a coarse analog-to-digital converter 18 which converts the analog input signal $V_{in}$ to a coarse digital representation which, in the illustrated embodiment, comprises the seven most significant bits (MSB) of the final 10 bit digital output. The seven bit output 20 of the converter 18 may be conveniently latched in a 7 bit output register 22 of the converter 10. The 7 bit output 20 of the first stage analog-to-digital converter 18 is also applied to a subranging circuit 24 which converts the 7 bit digital input to an analog signal which is subtracted from the analog input signal $V_{in}$ to generate a residue signal at an output 26. The residue signal is then applied to a second stage 28 of the converter 10 which includes a fine analog-to-digital converter 30 which converts the residue signal to a 3 bit digital representation outputted at a 3 bit digital output 32. These three bits are the least significant bits of the 10 bit digital representation and may be latched in a 3 bit register 34 of the digital output 14. Hence, the 7 bit output of the converter 18 may be combined with the 3 bit output of the converter 30 to provide all 10 bits of the digital conversion.

Figure 2:
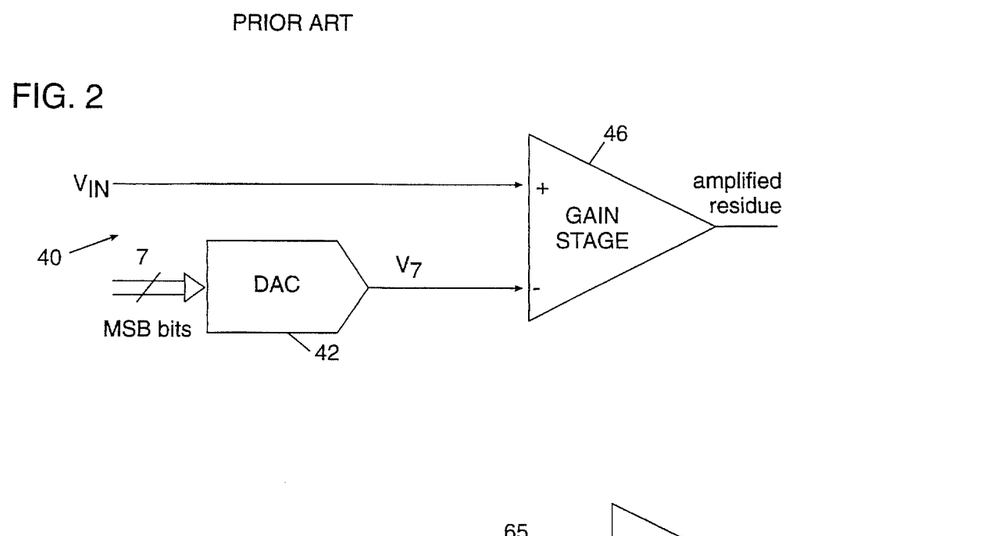
FIG. 2 is a schematic representation of a typical subranging amplifier.

FIG. 2 shows a typical prior art subranging amplifier circuit which is indicated generally at 40. The amplifier circuit 40 includes a digital to analog converter circuit 42 which converts the 7 bit digital output of a prior stage to an analog signal $V_7$. A gain stage circuit 46 amplifies the difference of the analog input signal $V_{in}$ and the analog signal $V_7$ to produce an amplified analog residue signal which may be applied to a subsequent analog-to-digital converter stage as described above.

Figure 3:
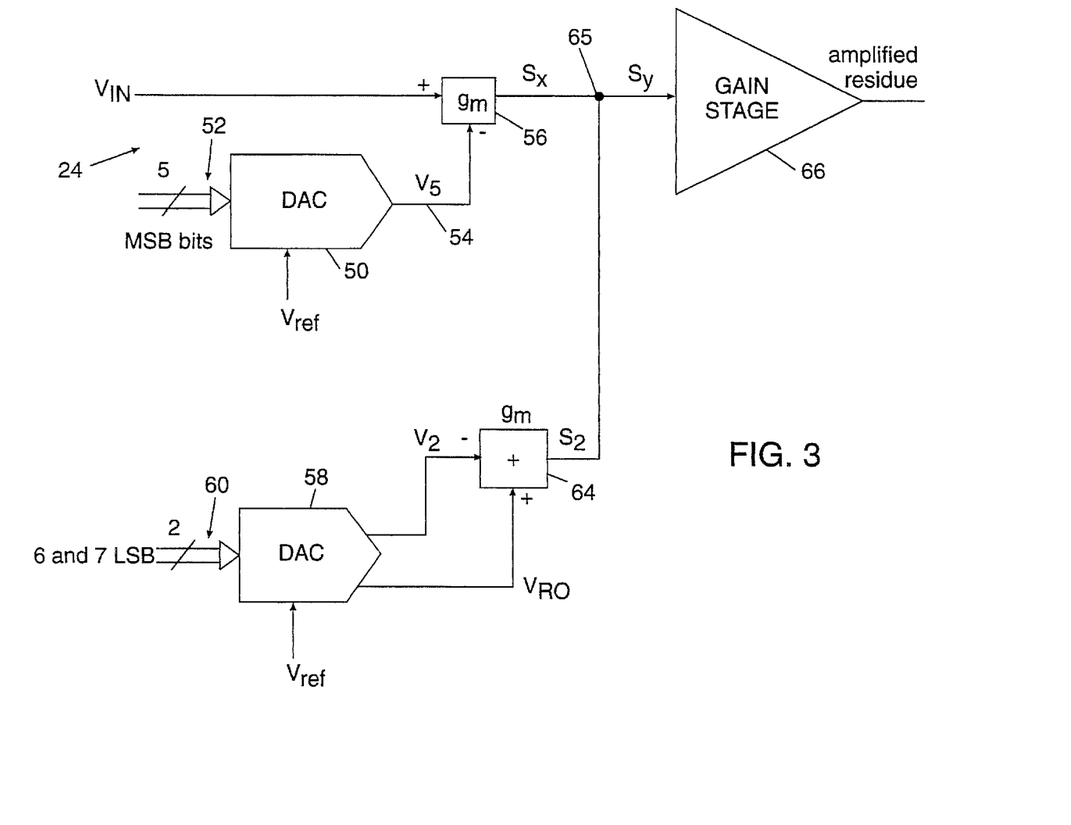
FIG. 3 is a schematic block diagram of a subranging amplifier in accordance with a preferred embodiment of the present invention.

As previously mentioned, various attempts have been made to simplify the digital-to-analog converter portion of the subranging amplifier circuit. However, many of these prior approaches have substantially slowed the conversion process or have required substantially increased power, or both. FIG. 3 illustrates the subranging amplifier circuit 24 of FIG. 1 in accordance with a preferred embodiment of the present invention, which substantially reduces the complexity of prior subranging circuits without a substantial sacrifice in speed or increased power consumption. This is achieved by, in the illustrated embodiment, subdividing the digital representation to be converted into two or more parts and separately subtracting from the analog input signal, analogs of each of the individual digital portions. For example, in the illustrated embodiment, the subranging circuit 24 effectively subtracts the analog of the 7 bit digital representation (the coarse bits) provided by the coarse A/D converter 18, from the analog input signal $V_{in}$, to produce a residue signal for conversion by the fine A/D converter 30. However, the 7 bit digital representation is first subdivided by the subranging circuit 24, into two parts in the illustrated embodiment, the five most significant bits in one part and the two least significant bits in the other part. A first digital-to-analog converter 50 of the subranging amplifier 24 converts the five most significant bits at a digital input 52 to an analog voltage signal $V_5$ which is a function of the five most significant bits as follows:

$$V_5 = \sum_{i=1}^{5} a_i 2^{-i} V_{ref} \qquad (1)$$

where $V_{ref}$ is the reference voltage applied to the digital to analog converter 50. The analog signal $V_5$ provided at an analog output 54 is coupled to the inverting input of a transconductance circuit 56 which subtracts it from the analog input voltage signal $V_{in}$ to produce an intermediate current signal $S_x$ which is a function of the difference between the analog input signal and $V_5$, the analog of the five most significant bits, as follows:

$$S_x = g_m \left( V_{in} - \sum_{i=1}^{5} a_i 2^{-i} V_{ref} \right) \qquad (2)$$

where $g_m$ is the transconductance of the transconductance circuit 56. At the same time, a second digital-to-analog converter circuit 58 converts the two least significant bits provided at a digital input 60 to an analog voltage signal $V_2$ which is a function of the two least significant bits as follows:

$$V_2 = V_{RO} + \sum_{i=6}^{7} a_i 2^{-i} V_{ref} \qquad (3)$$

where $V_{RO}$ is an internal reference voltage provided by the second digital to analog converter 58. The inverting input of a second transconductance circuit 64 is coupled to the output 62 of the converter 58, which transforms the analog voltage signal $V_2$ (after subtracting out the reference voltage $V_{RO}$) to a negative analog current signal $S_2$ which is also a function of the two least significant bits as follows:

$$S_2 = g_m \sum_{i=6}^{7} a_i 2^{-i} V_{ref} \qquad (4)$$

where $g_m$ is the transconductance of the second transconductance circuit 64. The analog current signal $S_2$ of the two least significant bits is then subtracted from the analog current difference signal $S_x$ provided by the transconductance circuit 56 at a summing junction 65, to produce the final current difference signal $S_y$ as follows:

$$S_y = g_m \left( V_{in} - \sum_{i=1}^{7} a_i 2^{-i} V_{ref} \right) \qquad (5)$$

In the illustrated embodiment, the final current difference signal $S_y$ is amplified by a transimpedance stage 66 to produce the amplified residue signal.

It is seen from the above that the analogs $V_5$ and $V_2$ of both the five most significant bits and the two least significant bits, respectively, of the seven most significant bits are generated separately and then effectively subtracted from the analog input signal $V_{in}$ to produce the residue signal. Because the input to the digital-to-analog converter 50 has a resolution of 5 bits, the digital-to-analog converter 50 may have as few as $2^5$ or 32 switches. Similarly, the digital-to-analog converter 58 having a digital input of 2 bits, may have as few as $2^2$ or 4 switches. Thus, the total number of switches utilized for the two digital-to-analog converters 50 and 58 may be reduced to as few as 36 switches (32+4) instead of requiring as many as $2^8$ or 128 switches. In this manner, by subdividing the digital representation to be converted into two or more portions, the resolution of each individual converter may be reduced such that the overall complexity of the circuit can be substantially reduced as well. It should be recognized that conventional techniques may be applied to each of the individual converters 50 and 58 to further reduce their complexity.

Equation (5) above points to another important aspect of the present invention. The subtraction in the above equation (in A/D converters) limits the maximum differential voltage $V_{diff}$ at the inputs of the first transconductance circuit 56 to $2^{-j} V_{ref}$ (where j is the number of bits applied to the first digital to analog converter 50). For many transconductance circuits the transconductance $g_m$ itself is a function of the differential input voltage. As a consequence, the larger the differential voltage, the larger the error of $g_m$. In the illustrated embodiment, this error is substantially reduced, first because of the above-mentioned limit on the maximum differential input voltage, $V_{diff}$, and second because the second transconductance circuit 64 creates a corresponding error which is subtracted from the error of the output of the first transconductance circuit 56 at summing junction 65.

Figure 4:
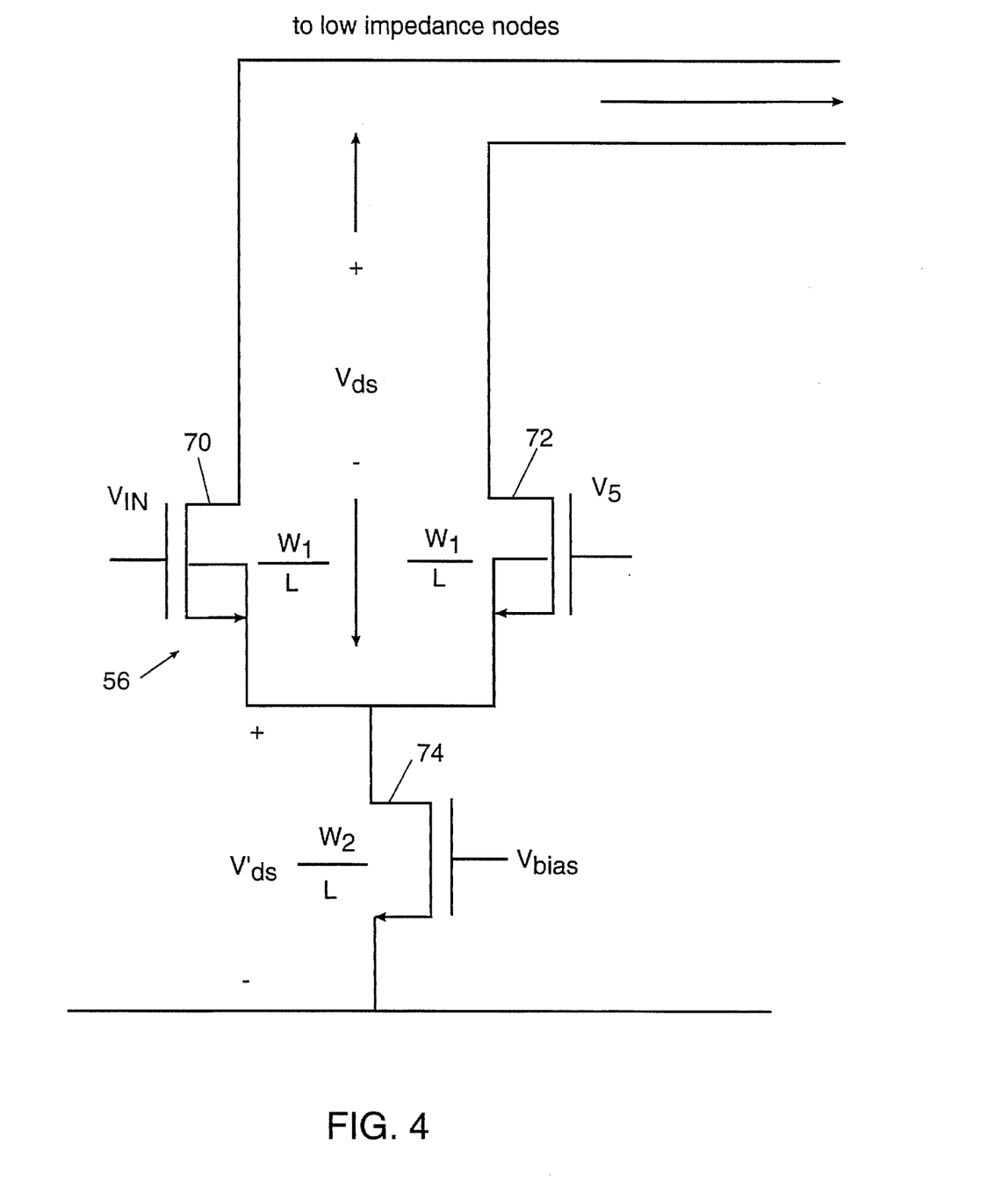
FIG. 4 is a schematic diagram of a transconductance circuit for the subranging amplifier of FIG. 3.

Referring now to FIG. 4, a transconductance circuit in accordance with a preferred embodiment of the present invention is indicated generally at 56. The transconductance circuit 56 includes a pair of differential MOS input transistors 70 and 72, the inputs of which are coupled to the analog input signals $V_{in}$ and $V_5$, respectively.

Input differential pairs typically utilize a cascode "tail" current source to reduce the variation of the current in the input differential pair as a result of common-mode voltage change. However, this reduction in variation of current in IDP devices does not result in the over-drive voltage (the difference between the gate to source voltage $V_{gs}$ and the threshold voltage $V_t$) of pair devices being fixed as well, as can be seen from the following equation:

$$I_{D(fixed)} = \frac{1}{2} I_{source} = (V_{gs} - V_t)^2 (1 + \lambda V_{ds}) \quad (6)$$

Thus, if the drain to source voltage $V_{ds}$ rises, the overdrive voltage $(V_{gs} - V_t)$ will drop. This is due to channel length modulation of the pair devices. Thus, the transconductance $g_m$ of the input differential pair, typically varies with the common-mode signal through the variation of the over-drive $(V_g - V_t)$ of the pair devices as:

$$g_m = I_{source} \div (V_{gs} - V_t) \quad (7)$$

As shown in FIG. 3 above, the transconductance circuits 56 and 64 receive two different input voltages $V_5$ and $V_2$. Hence, the common-mode voltages of the two transconductance circuits 56 and 64 will usually differ significantly. It will be appreciated that variation in the transconductance of each transconductance circuit as a function of common-mode voltage changes could lead to erroneous results.

In accordance with another aspect of the present invention, a current source 74 coupled to the sources of the input transistors 70 and 72 of the transconductance circuit 56 is implemented with a single MOS transistor having the same channel length as the differential pair transistors 70 and 72 which are placed in a floating well. It has been found that this arrangement substantially reduces variation in the transconductance $g_m$ of the input differential pair as a function of common-mode voltage. As the common-mode voltage increases, the drain to source voltage $V_{ds}$ of the input differential pair devices 70 and 72 decreases. Because the outputs of the differential input transistors 70 and 72 are coupled to low impedance nodes, the voltage across the transconductance circuit 56 is relatively independent of changes in common-mode voltage $V_{cm}$. As a consequence, as the common-mode voltage increases and the drain to source voltage $V_{ds}$ of the differential input pair devices 70 and 72 decreases, the drain to source voltage $V'_{ds}$ of the current source transistor 74 increases. As the current of the source device 74 and pair devices 70, 72 change with the common-mode voltage $V_{cm}$, so does the over-drive voltage $(V_{gs} - V_t)$ of the pair devices. Because the single device current source transistor 74 has the same channel length as the differential input transistors 70 and 72, these two effects tend to compensate each other such that variation in the transconductance $g_m$ is substantially reduced. The transconductance circuit 64 is implemented in a similar fashion.

Figure 5:
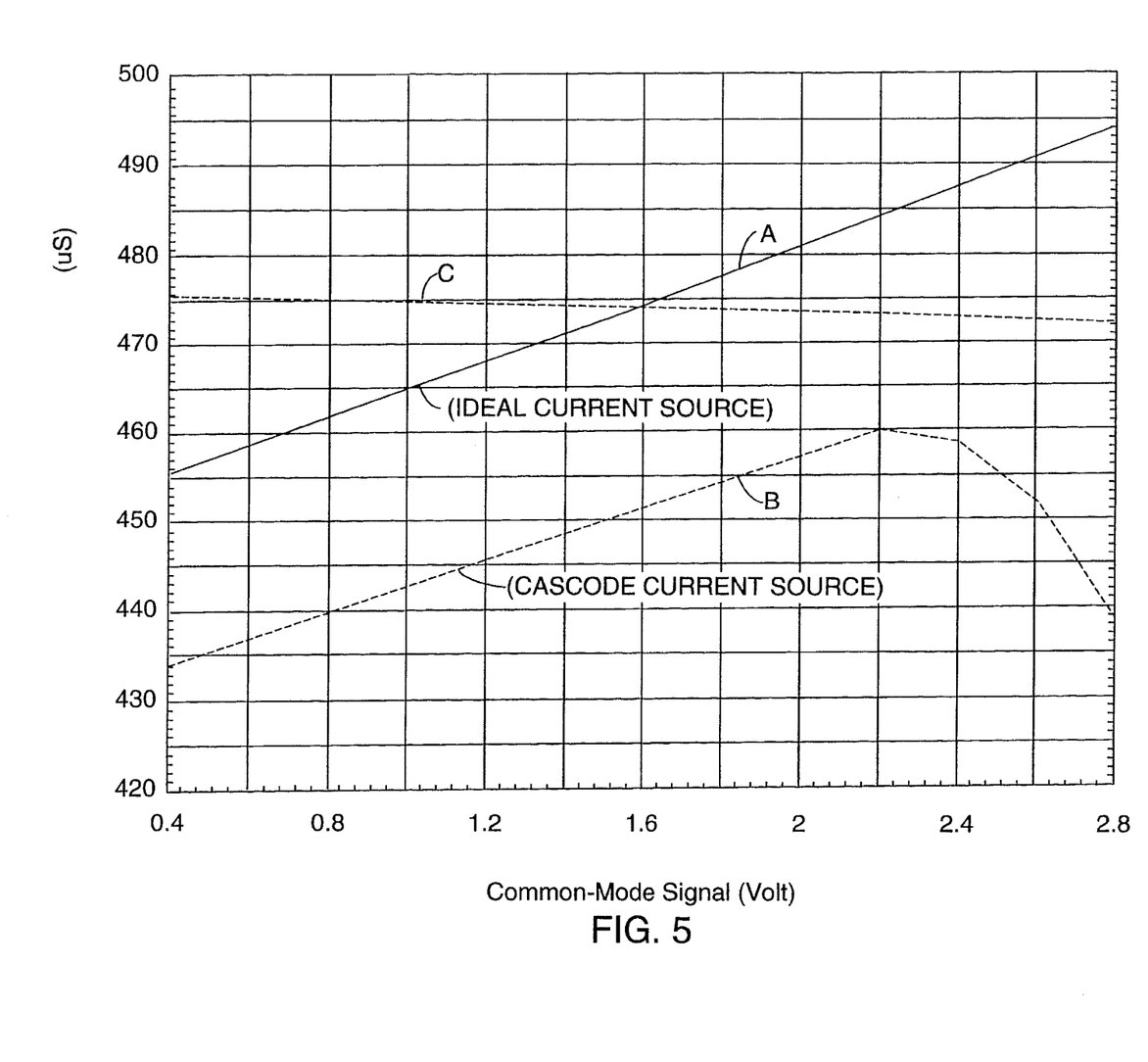
FIG. 5 is a graph depicting the variation of transconductance for a differential pair type transconductance circuit having three different types of current sources.

FIG. 5 is a graph depicting the variation of the transconductance of a PMOS input differential pair (IDP) as a function of three different types of current sources. Line A indicates that the transconductance of a MOS input differential pair having an ideal current source increases linearly with the common-mode voltage signal. The variation in transconductance for an input differential pair is similar for a pair utilizing a cascode current source as indicated at line B, but the transconductance falls off at a common-mode signal of approximately 2.2 volts for that specific circuit. The specific fall off voltage will vary depending upon the particular design. In contrast, line C indicates that the transconductance of a MOS input differential pair having a matched-length single device current source as described above is relatively independent of changes in common-mode voltage.

Figure 6:
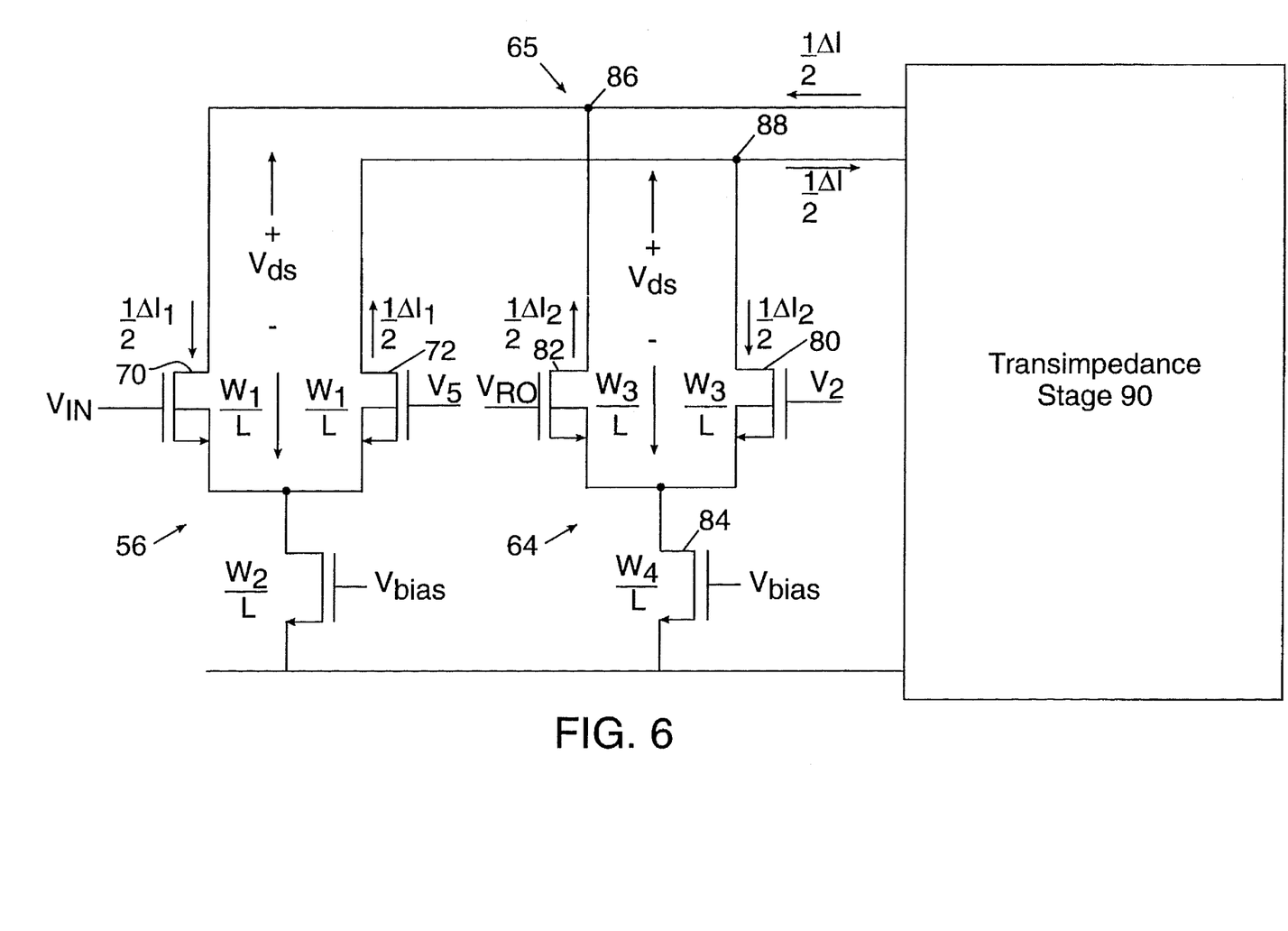
FIG. 6 is a schematic diagram of the transconductance circuits and transimpedance stage for the subranging amplifier of FIG. 3.

FIG. 6 depicts the interconnection of the transconductance circuits 56 and 64 in greater detail. As previously mentioned, the transconductance circuit 56 includes a pair of input differential MOS transistors 70 and 72, the sources of which are coupled to a single MOS transistor current source 74. Similarly, the transconductance circuit 64 includes a pair of differential input MOS transistors 80 and 82, the sources of which are coupled to a single MOS transistor current source 84. The drains of the input transistors 70 and 82 of the transconductance circuits 56 and 64, respectively, are connected to a common output node 86 of the summing junction 65 and the drains of the input transistors 72 and 80 of the transconductance circuits 56 and 64, respectively, are coupled to a second common output node 88 of the summing junction 65. The currents drawn from the output nodes 86 and 88 by the differential input transistors 70 and 72 will vary in accordance with the voltage difference between the analog input signal $V_{in}$ and the analog voltage $V_5$ of the five most significant bits. For example, if the input voltage $V_{in}$ is greater than that of the input voltage $V_5$, the current carried by the input transistor 70 will increase and the current carried by the input transistor 72 will decrease, a corresponding amount. Thus, the change in currents at the nodes 86 and 88 is a function of the difference between the input voltages $V_{in}$ and $V_5$. In this manner, the transconductance circuit 56 "subtracts" the analog value $V_5$ of the five most significant bits from the analog input signal $V_{in}$.

Similarly, the currents drawn from the same output nodes 86 and 88 by the differential input transistors 80 and 82 are also a function of the difference in voltage between the voltage inputs $V_{R0}$ and $V_2$, which difference is the analog value of the two least significant bits. In this manner, the analog value $(V_2 - V_{R0})$ of the two least significant bits is also "subtracted" from the analog input signal $V_{in}$.

Because conversion of the 7 bit input to the subranging circuit 24 has been separated to produce two separate analog values, $V_5$ and $V_2$, the common-mode voltages applied to the transconductance circuit 56 and the transconductance circuit 64 are not necessarily the same. Hence, variation in transconductance of the input differential pairs as a function of common-mode voltage could lead to erroneous results. However, by providing single transistor current sources for each input differential pair as described above, variation in transconductance as a function of common-mode voltage has been substantially reduced or eliminated.

Figure 7:
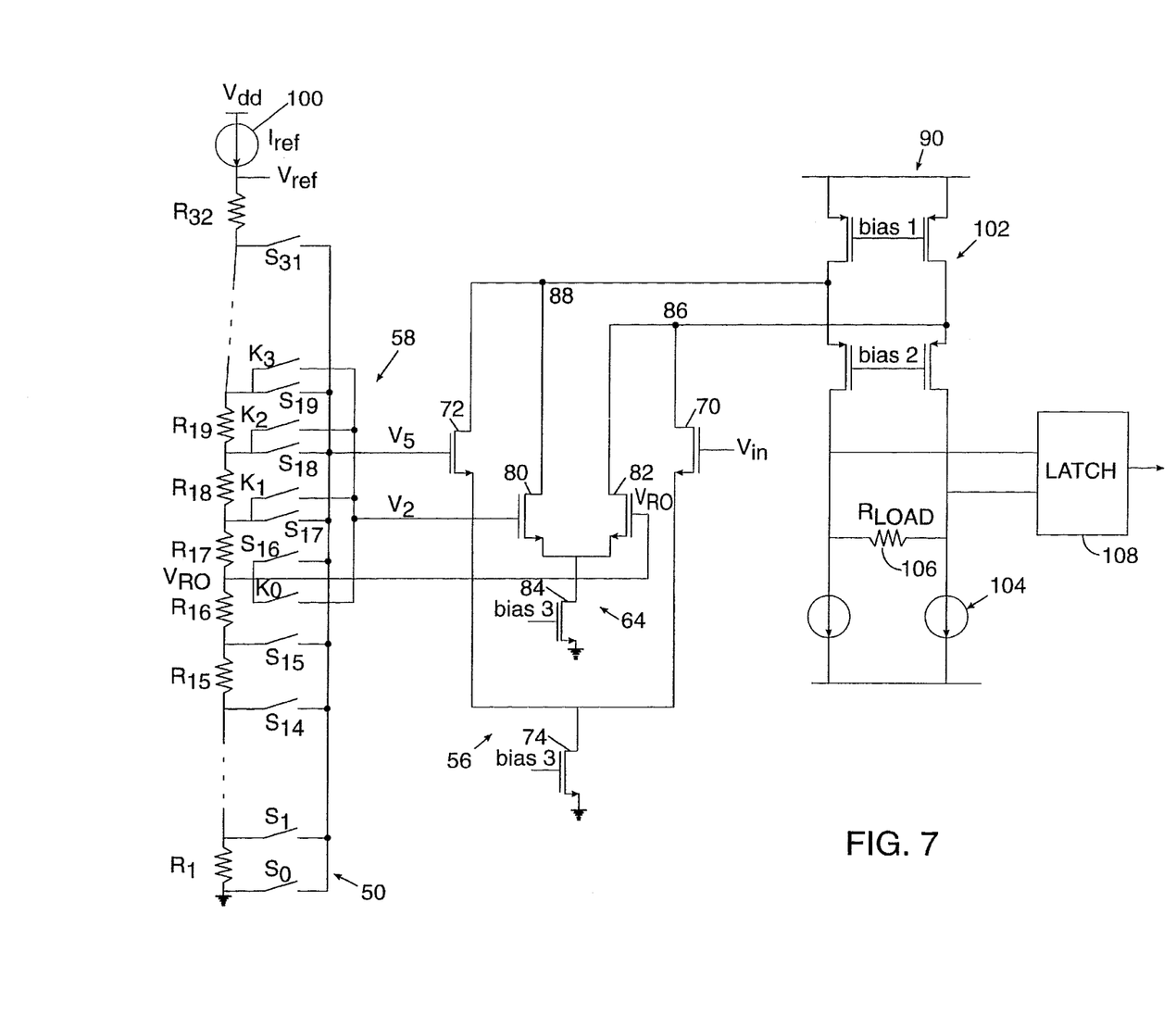
FIG. 7 is a more detailed schematic diagram of the subranging amplifier of FIG. 6.

FIG. 7 shows the subranging circuit 24 in still greater detail which is preferably implemented with a 2 micron digital CMOS process for the illustrated embodiment. The 5 bit digital-to-analog converter 50 of the subranging circuit 24 includes a string of 32 resistors $R_1-R_{32}$. The constant current source 100 provides a constant current through the resistor string such that the resistor string provides thirty-one incremental reference voltages (in increments of $V_{Ref}/32$) at voltage taps between adjacent resistors. Associated with each voltage tap is one of thirty-two switches, $S_0-S_{31}$, which couples the associated incremental reference voltage to the input of the transistor 72 of the transconductance circuit 56. The switches $S_1$–$S_{31}$ are operated by a decoder circuit (not shown) which closes one of the thirty-two switches in accordance with the values of the 5 bits of the digital input of the digital-to-analog converter 50. Thus, in response to a digital input of 00001, switch 1 is closed such that the smallest incremental voltage is coupled to the input $V_5$ of the input transistor 72. Alternatively, a digital input of 11111 results in the switch $S_{31}$ being closed thereby coupling the largest incremental reference voltage to the analog input $V_5$ of the input transistor 72. In this manner, the digital input is converted to a corresponding analog signal $V_5$.

The output nodes 86 and 84 of the transconductance circuits 56 and 64 are coupled to the transimpedance stage 90 which includes two strings of biasing transistors 102 and current sources 104 coupled by a load resistor 106. A latch circuit 108 may be coupled across the transimpedance strings if it is desired to use the subranging circuit 24 as a comparator.

In accordance with another aspect of the present invention, the transistor sizes of the second transconductance circuit 64 are scaled relative to the transistor sizes of the transconductance circuit 56 such that a portion of the same resistor string $R_1$–$R_{32}$ may be used for a second digital-to-analog converter 58' resulting in a substantial reduction in the total number of required resistors. More specifically, a 7 bit flash digital-to-analog converter typically requires $2^7$ or 128 resistors to provide 128 incremental voltages. As set forth above, the digital-to-analog converter 50 for converting a 5 bit digital input provides $2^5$ or 32 incremental voltages. The digital-to-analog converter 58 of FIG. 3 converts a 2 bit input and provides 4 incremental voltages in response. However, because the bits converted by the digital-to-analog converter 58 of FIG. 3 are the two least significant bits and the 5 bits converted by the digital-to-analog converter 50 are the five most significant bits, the voltage increments provided by the digital-to-analog converter 50 are four times greater than that of the voltage increments of the digital-to-analog converter 58 of FIG. 3. On the other hand, if the converters 50 and 58' of FIG. 7 use the same resistor string $R_1$–$R_{32}$, the increments of voltage of the second digital-to-analog converter 58' are the same as those of the first digital-to-analog converter 50, that is, $V_{Ref}/32$. This increment of voltage is four times that of the digital-to-analog converter 58 of FIG. 3.

In order for the second digital-to-analog converter 58' of FIG. 7 to use the same resistor string as that of the digital-to-analog converter 50, the transistor devices 80, 82 and 84 of the second transconductance circuit 64 are scaled to have a width and therefore a transconductance one-fourth that of the transistor devices 70, 72 and 74 of the transconductance circuit 56. In this manner, the increased size of the increments of voltage of the second converter 58' is effectively compensated. However, the channel lengths of each of the transistor devices 70, 72 and 74, 80, 82 and 84 are all the same so as to reduce transconductance variation as a function of common-mode voltage, as described above. Such an arrangement of resistor sharing not only saves area, but also increases the probability of achieving a higher degree of precision matching in the resistor string.

In the illustrated embodiment, the digital-to-analog converter circuit 58' of FIG. 7 uses the four resistors $R_{16}$–$R_{19}$ of the resistor string of the converter 50, to provide the necessary four incremental reference voltages for converting the two least significant bits to the analog signal $V_2$. The converter circuit 58' has four switches, $K_0$–$K_3$, each of which are coupled to the associated tap of the resistor string $R_{16}$–$R_{19}$. One of the switches $K_0$–$K_3$ is closed, depending upon the values of the 2 bit digital input to the converter 58. Upon closing of the one of the switches $K_0$–$K_3$, the appropriate incremental reference voltage $V_2$ is coupled to the input of the differential input transistor 80 of the transconductance circuit 64. The input of the other differential input transistor 82 is coupled to the mid-point reference voltage $V_{R0}$ of the resistor string $R_1$–$R_{32}$.

It should be appreciated that other arrangements are also possible. For example, if the resistor string 50 has sixty-four resistors so as to provide sixty-four incremental reference voltages, the transistor devices of the transconductance circuit 64 may be scaled to have a width one-half that of the transistor devices of the transconductance circuit 56. Thus, it is seen that for a subranging circuit for converting h bits and having a resistor string of $2^j$ resistors where $j \leq h$, the transistor devices of the transconductance circuit 64 will be scaled to have a width which is the fraction $2^j/2^h$ of the width of the transistors of the transconductance circuit 56.

Also, rather than dividing the 7 bit digital input to the subranging circuit into a 5 bit most significant bit digital input and a 2 bit least significant bit input, other subdivisions are possible as well such as, for example, a 4 bit most significant bit input and a 3 bit least significant bit input. Still further, the digital input may be subdivided into more than two groups. For example, the digital input to the subranging circuit may be divided into a 3 bit most significant bit input, a 2 bit intermediate significant bit input and a 2 bit least significant bit input.

In the case of a bipolar implementation, the differential pairs can include degeneration resistors or other elements. Also, a bipolar implementation can utilize single device sources as well as other sources.

Further arrangements of the digital-to-analog converters and the transconductance circuits are also possible. For example, the subranging and comparator circuits of the present invention are fully applicable to successive-approximation converters and pipeline converters as well as the multi-step converter of the illustrated embodiment. Also, the functions to which the digital representations are transformed may also vary.

It is seen from the above that the present invention provides a unique method of implementing the digital-to-analog converters of subranging stages and comparators in a manner which significantly reduces the complexity of the circuits without incurring a substantial penalty in either speed or increased current consumption. It will, of course, be understood that further modifications of the present invention, in its various aspects, will be apparent to those skilled in the art, some being apparent only after study and other being merely matters of routine electronic design. For example, a transistor technology other than CMOS may be substituted. Other embodiments are also possible, their specific designs depending upon the particular application. As such, the scope of the invention should not be limited by the particular embodiments herein described but should be only defined by the appended claims and equivalents thereof.

I claim:

1. An analog to digital converter for converting an analog input voltage signal to a digital representation, comprising:

a first digital to analog converter for converting a first plurality of bits to a first analog voltage signal;

a first pair of differential input transistors having a pair of inputs coupled to the first analog voltage signal and the analog input voltage signal to produce a first analog difference signal;

a second digital to analog converter for converting a second plurality of bits to a second analog voltage signal; and a second pair of differential input transistors having a pair of inputs coupled to the second analog voltage signal and a reference voltage signal to produce a second analog difference signal;

a coupler circuit for coupling the first and second analog difference signals to produce an analog residual signal; and a residual converter for converting the residual analog signal to a digital representation.

2. The converter of claim 1 wherein each transistor of the pairs of differential input transistors are MOS transistors and the channel width of transistors of the second pair is scaled relative to the channel width of the first pair.

3. The converter of claim 1 wherein the transistors are MOS transistors and each pair of differential input transistors has a single MOS transistor current source providing current to the associated pair.

4. The converter of claim 3 wherein each transistor of the pairs of differential input transistors and associated current sources has the same channel length.

5. The converter of claim 3 wherein the channel width of the transistors of the second pair and its associated same channel length current source is scaled relative to the channel width of the transistors of the first pair and its associated same channel length current source.

6. An analog to digital converter for converting an analog input voltage signal to a digital representation of h bits, comprising:

a first digital to analog converter for converting a first plurality of bits to a first analog voltage signal, said first converter comprising a string k of resistors connected in series, wherein k is less than $2^h$;

a first pair of differential input MOS transistors having a pair of inputs coupled to the first analog voltage signal and the analog input voltage signal, respectively, to produce a first analog difference signal;

a second digital to analog converter for converting a second plurality of bits to a second analog voltage signal, said second converter comprising at least a portion of the string of series-connected resistors of the first converter; and a second pair of differential input MOS transistors having a pair of inputs coupled to the second analog voltage signal and a tap point of the string of series-connected resistors of the first converter, respectively, to produce a second analog difference signal, said second pair of differential input transistors being scaled in size relative to the first pair of differential input transistors so that the second pair has a transconductance $g_m$ which is a fraction of the transconductance of the first pair;

a coupler circuit for coupling the first and second analog difference signals to produce an analog residual signal; and a residual converter for converting the residual analog signal to a digital representation.

7. The converter of claim 6 wherein the transconductance $g_m$ of the second pair is a fraction $1/n$, wherein n is an integer, of the transconductance of the first pair.

8. The converter of claim 6 wherein the first plurality of bits equals j bits and the string of k resistors does not exceed $2^j$ resistors.

9. The converter of claim 8 wherein the transconductance $g_m$ of the second pair is a fraction $2^j/2^h$ of the transconductance of the first pair.

10. The converter of claim 6 wherein the first plurality of bits equals j bits and the string of k resistors exceeds $2^j$ resistors.

11. An analog to digital converter for converting an analog input voltage signal to a digital representation, comprising:

a first analog to digital converter for converting a first portion of the analog input signal to a first plurality of bits and a second plurality of bits;

a first digital to analog converter for converting the first plurality of bits to a first analog voltage signal;

a first transconductance circuit for providing a first current signal which is a function of the difference between the first analog voltage signal and the analog input voltage signal;

a second digital to analog converter for converting the second plurality of bits to a second analog voltage signal;

a second transconductance circuit for providing a second current signal which is a function of the second analog voltage signal;

an output node for providing a residual current signal which is a function of the difference between the first and second current signals; and a residual converter for converting the residual current signal to a digital representation.

12. A subranging circuit for an analog to digital converter for converting an analog input voltage signal to a digital representation, comprising:

a first digital to analog converter for converting a first plurality of bits to a first analog voltage signal;

a first transconductance circuit for providing a first current signal which is a function of the difference between the first analog voltage signal and the analog input voltage signal;

a second digital to analog converter for converting the second plurality of bits to a second analog voltage signal;

a second transconductance circuit for providing a second current signal which is a function of the second analog voltage signal; and an output node for providing a residual current signal which is a function of the difference between the first and second current signals.

13. The subranging circuit of claim 12 further comprising a transimpedance stage for converting the residual current signal to a residual voltage signal.

14. A comparator for comparing an analog input voltage signal to the analog of a digital representation, comprising:

a first digital to analog converter for converting a first plurality of bits to a first analog voltage signal;

a first transconductance circuit for providing a first current signal which is a function of the difference between the first analog voltage signal and the analog input voltage signal;

a second digital to analog converter for converting the second plurality of bits to a second analog voltage signal;

a second transconductance circuit for providing a second current signal which is a function of the second analog voltage signal;

an output node for providing a residual current signal which is a function of the difference between the first and second current signals; and a latch for latching a digital value as a function of the residual current signal.

15. A circuit for processing an analog input voltage signal and a digital representation, comprising:
   a first digital to analog converter for converting a first plurality of bits to a first analog voltage signal;
   a first pair of differential input transistors having a pair of inputs coupled to the first analog voltage signal and the analog input voltage signal to produce a first analog current signal;
   a second digital to analog converter for converting a second plurality of bits to a second analog voltage signal; and
   a second pair of differential input transistors having a pair of inputs coupled to the second analog voltage signal and a reference voltage signal to produce a second analog current signal;
   an output circuit for providing an output signal which is a function of the difference between the first and second analog current signals.

16. The circuit of claim 15 wherein each transistor of the pairs of differential input transistors are MOS transistors and the channel width of transistors of the second pair is scaled relative to the channel width of the first pair.

17. The circuit of claim 15 wherein each transistor of the pairs of differential input transistors is a MOS transistor and each pair of differential input transistors has a single MOS transistor current source providing current to the associated pair.

18. The circuit of claim 17 wherein each transistor of the pairs of differential input transistors and associated current sources has the same channel length.

19. The circuit of claim 17 wherein the channel width of the transistors of the second pair and its associated same channel length current source is scaled relative to the channel width of the transistors of the first pair and its associated same channel length current 20. A comparator for comparing an analog input signal to a digital representation, comprising:
   a first digital to analog converter for converting a first plurality of bits to a first analog signal;
   a first pair of differential input transistors having a pair of inputs coupled to the first analog signal and the analog input signal to produce a first analog difference signal;
   a second digital to analog converter for converting a second plurality of bits to a second analog signal; and
   a second pair of differential input transistors having a pair of inputs coupled to the second analog signal and a reference signal to produce a second analog difference signal;
   a coupler circuit for coupling the first and second analog difference signals to produce an analog residual signal; and
   a latch that latches to a digital value as a function of the residual signal.

21. The comparator of claim 20 wherein each transistor of the pairs of differential input transistors are MOS transistors and the channel width of transistors of the second pair is scaled relative to the channel width of the first pair.

22. The comparator of claim 20 wherein each transistor is a MOS transistor and each pair of differential input MOS transistors has a single transistor current source providing current to the associated pair.

23. The comparator of claim 22 wherein each transistor of the pairs of differential input transistors and associated current sources has the same channel length.

24. The comparator of claim 23 wherein the channel width of the transistors of the second pair and its associated same channel length current source is scaled relative to the channel width of the transistors of the first pair and its associated same channel length current source.

25. An analog to digital converter for converting an analog input voltage signal to a digital representation of h bits, comprising:
   a first analog to digital converter for converting a portion of the analog input voltage signal to a digital representation comprising first and second pluralities of bits;
   a first digital to analog converter for converting the first plurality of bits to a first analog voltage signal, said first converter comprising a string k of resistors connected in series, wherein k is less than $2^h$;
   a first pair of differential input MOS transistors having a pair of inputs coupled to the first analog voltage signal and the analog input voltage signal, respectively, to produce a first analog current signal which is a function of the difference between the first analog voltage signal and the analog input voltage signal;
   a second digital to analog converter for converting the second plurality of bits to a second analog voltage signal, said second converter comprising at least a portion of the string of series-connected resistors of the first converter; and
   a second pair of differential input MOS transistors having a pair of inputs coupled to the second analog voltage signal and a tap point of the string of series-connected resistors of the first converter, respectively, to produce a second analog current signal which is a function of the second analog input signal, said second pair of differential input MOS transistors being scaled in transconductance relative to the first pair of differential input transistors so that the second pair has a transconductance $g_m$ which is a fraction of the transconductance of the first pair;
   a transimpedance stage coupled to the outputs of the first and second pairs of differential input MOS transistors to provide a residual voltage signal which is a function of the difference between the first and second analog current signals; and
   a residual converter for converting the residual analog voltage signal to a digital representation.

26. A processing circuit for processing an analog input voltage signal and a digital representation of h bits or more, comprising:
   a first digital to analog converter for converting a first plurality of bits to a first analog voltage signal, said first converter comprising a string k of resistors connected in series, wherein k is less than $2^h$;
   a first pair of differential input transistors having a pair of inputs coupled to the first analog signal and the analog input signal, respectively, to produce a first analog current signal which is a function of the difference between the first analog voltage signal and the analog input voltage signal;
   a second digital to analog converter for converting the second plurality of bits to a second analog voltage signal, said second converter comprising at least a portion of the string of series-connected resistors of the first converter; and
   a second pair of differential input transistors having a pair of inputs coupled to the second analog voltage signal and a tap point of the string of series-connected resistors of the first converter, respectively, to produce a second analog current signal which is a function of the second analog voltage signal, said second pair of differential input transistors being scaled in transconductance relative to the first pair of differential input transistors so that the second pair has a transconductance $g_m$ which is a fraction of the transconductance of the first pair.

27. The processing circuit of claim 26 further comprising:

a transimpedance stage coupled to the outputs of the first and second pairs of differential input transistors to provide a residual voltage signal which is a function of the difference between the first and second analog current signals; and a latch for providing a digital output as a function of the residual voltage signal.

28. The circuit of claim 26 wherein the transconductance $g_m$ of the second pair is a fraction 1/n, wherein n is an integer, of the transconductance of the first pair.

29. The circuit of claim 26 wherein the first plurality of bits equals j bits and the string of k resistors does not exceed $2^j$ resistors.

30. The circuit of claim 29 wherein the transconductance $g_m$ of the second pair is a fraction $2^j/2^h$ of the transconductance of the first pair.

31. The circuit of claim 26 wherein the first plurality of bits equals j bits and the string of k resistors exceeds $2^j$ resistors.

32. The circuit of claim 26 wherein the transistors are MOS transistors.

* * * * *